United States Patent
Kim

(10) Patent No.: US 6,624,488 B1
(45) Date of Patent: Sep. 23, 2003

(54) EPITAXIAL SILICON GROWTH AND USAGE OF EPITAXIAL GATE INSULATOR FOR LOW POWER, HIGH PERFORMANCE DEVICES

(75) Inventor: Hyeon-Seag Kim, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 60 days.

(21) Appl. No.: 09/633,576

(22) Filed: Aug. 7, 2000

(51) Int. Cl.[7] .................. H01L 29/76; H01L 29/94; H01L 31/062; H01L 31/113; H01L 31/119
(52) U.S. Cl. .................. 257/411; 257/310; 257/410
(58) Field of Search .................. 257/310, 406, 257/411, 410, 412, 324, 325, 69, 67, 344, 295, 402, 288; 438/287, 240, 216, 261, 591, 217, 222

(56) References Cited

U.S. PATENT DOCUMENTS

| | | | | |
|---|---|---|---|---|
| 4,453,172 A | * | 6/1984 | Farrow et al. | 257/289 |
| 5,605,854 A | * | 2/1997 | Yoo | 438/157 |
| 5,963,810 A | * | 10/1999 | Gardner et al. | 438/287 |
| 6,064,077 A | * | 5/2000 | Sandaresan | 257/23 |
| 6,171,900 B1 | * | 1/2001 | Sun | 438/240 |
| 6,221,708 B1 | * | 4/2001 | Gonzalez et al. | 438/216 |
| 6,274,442 B1 | * | 8/2001 | Gardner et al. | 438/287 |
| 6,287,903 B1 | * | 9/2001 | Okuno et al. | 438/197 |
| 6,335,238 B1 | * | 1/2002 | Hanttangady et al. | 438/240 |
| 6,528,856 B1 | * | 3/2003 | Bai et al. | 257/411 |

FOREIGN PATENT DOCUMENTS

| | | | | |
|---|---|---|---|---|
| EP | 0291951 | * | 11/1988 | H01L/29/62 |
| JP | 404258115 A | * | 9/1992 | 117/97 |
| JP | 409045904 A | * | 2/1997 | H01L/29/78 |

* cited by examiner

*Primary Examiner*—Shouxiang Hu
(74) *Attorney, Agent, or Firm*—LaRiviere, Grubman & Payne, LLP

(57) ABSTRACT

A method for reducing off-state leakage current of a MOSFET while promoting the formation of an epitaxial gate insulator layer between the substrate and gate stack includes implanting source/drain dopant into the substrate, and then forming a very thin epitaxial Silicon layer on the substrate by, e.g., molecular beam epitaxy. The high-k gate insulator layer is then deposited on the epitaxial layer, without an interfering native oxide or interfacial oxide being formed between the insulator layer and substrate, while establishing a very steep retrograde dopant profile and hence reducing off-state leakage current through the channel region.

3 Claims, 1 Drawing Sheet

EPITAXIAL SILICON GROWTH AND USAGE OF EPITAXIAL GATE INSULATOR FOR LOW POWER, HIGH PERFORMANCE DEVICES

TECHNICAL FIELD

The present invention relates generally to semiconductor fabrication, and more particularly to methods for reducing off-state leakage current in MOSFETs while permitting relatively high drive currents.

BACKGROUND OF THE INVENTION

Semiconductor chips or wafers are used in many applications, including as processor chips for computers, and as integrated circuits and as flash memory for hand held computing devices, wireless telephones, and digital cameras. Regardless of the application, it is desirable that a semiconductor chip hold as many circuits or memory cells as possible per unit area. In this way, the size, weight, and energy consumption of devices that use semiconductor chips advantageously is minimized, while nevertheless improving the memory capacity and computing power of the devices.

A common circuit component of semiconductor chips is the metal oxide silicon field effect transistor (MOSFET). In ULSI semiconductor chips, a MOSFET is established by forming a polysilicon gate on a silicon substrate, and then forming a source region and a drain region side by side in the substrate beneath the gate by implanting appropriate dopant materials into the areas of the substrate that are to become the source and drain regions, with a channel region being defined between the source and drain. The gate is insulated from the substrate by a thin gate insulator layer. This generally-described structure cooperates to function as a transistor.

One of the considerations in making a MOSFET is minimizing the current that passes through the channel between the source and drain ("leakage current") when the MOSFET is in the off state, which can otherwise degrade MOSFET performance. At the same time, it is desirable that the MOSFET be configured to permit the use of relatively high drive currents when the MOSFET is in the on state, to improve MOSFET performance. These two considerations can compete with each other. Specifically, to increase the drive current, the dopant concentration in the source and drain should be high, but to reduce off-state leakage current, it is desirable that the dopant not excessively diffuse into the channel region.

Another performance consideration related to the channel region is that the gate insulator layer between the MOSFET gate and the channel portion of the substrate should be highly insulative, to optimize MOSFET performance. To this end, so-called "high-k" gate insulator materials, typically metal oxides, have been developed. As recognized herein, however, it can be difficult to establish a high-k gate insulator using sputtering or chemical vapor deposition (CVD) because of the material transitions between the Silicon and the metal oxide insulator. The present invention, having made these critical observations, provides a method for reducing leakage current while promoting high-k gate insulator layer formation.

BRIEF SUMMARY OF THE INVENTION

A method is disclosed for forming a transistor on a semiconductor substrate having a surface. The method includes establishing an epitaxial layer between the surface and a transistor gate insulator layer. Preferably, the epitaxial layer includes Silicon, and it can be formed by, e.g., molecular beam epitaxy.

In a preferred embodiment, a gate stack is formed on the gate insulator layer, which advantageously is made from a high-k insulator material such as a metal oxide material. Dopant is implanted into the substrate, prior to establishing the epitaxial layer. If desired, prior to implanting the dopant a sacrificial Silicon oxide layer can be formed on the substrate and then removed after dopant implantation to establish a steep retrograde dopant profile from the surface of the substrate.

In another aspect, a MOSFET device includes a Silicon substrate, a transistor gate stack, and a gate insulator layer between the substrate and the gate stack. Furthermore, an epitaxial layer is formed between the gate insulator layer and the substrate. In one preferred embodiment, the epitaxial layer has a thickness of from twenty Angstroms to thirty nanometers (20Å–30nm). With this structure, a very steep retrograde dopant profile is established for reducing off-state leakage current of a MOSFET while promoting the formation of a high-k gate insulator layer between the substrate and gate stack without an interfering native oxide or interfacial oxide being formed between the insulator layer and substrate.

Other features of the present invention are disclosed or apparent in the section entitled "DETAILED DESCRIPTION OF THE INVENTION."

DETAILED DESCRIPTION OF THE INVENTION

Figure 1:
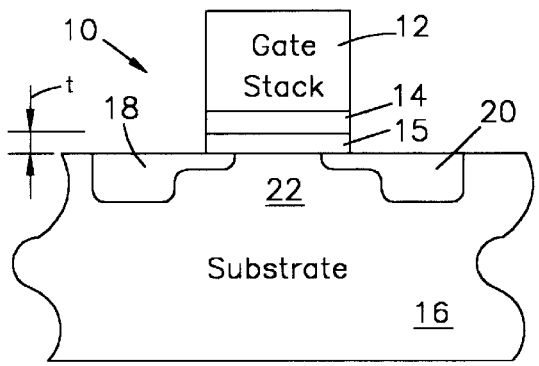
FIG. 1 is a schematic diagram of a MOSFET made according to the present invention.

Referring initially to FIG. 1, a semiconductor device 10 is shown having plural gate stacks 12 (only a single gate stack 12 shown for clarity) formed on a gate insulator layer 14, preferably a high-k gate insulator layer made from a metal oxide such as Titanium Oxide. The gate insulator layer 14 in turn is formed on a very thin epitaxial Silicon layer 15, which in turn is formed on a semiconductor substrate 16 such as Silicon. The epitaxial layer 15 can be undoped or doped to, e.g., $1 \times 10^{16}$ atoms per cubic centimeter. The gate stack 12 can be, e.g., five hundred to fifteen hundred Angstroms (500Å–1500Å) thick, the epitaxial layer 15 can have a thickness "t" of twenty Angstroms to thirty nanometers (20Å–30nm), and the insulator layer 14 can physically be, e.g., five to one hundred Angstroms (5Å–100Å) thick, although thinner or thicker layers can be used. As shown, the substrate 16 includes regions 18, 20 which establish source and drain regions of a MOSFET according to the present invention, with a channel region 22 being established therebetween.

Figure 2:
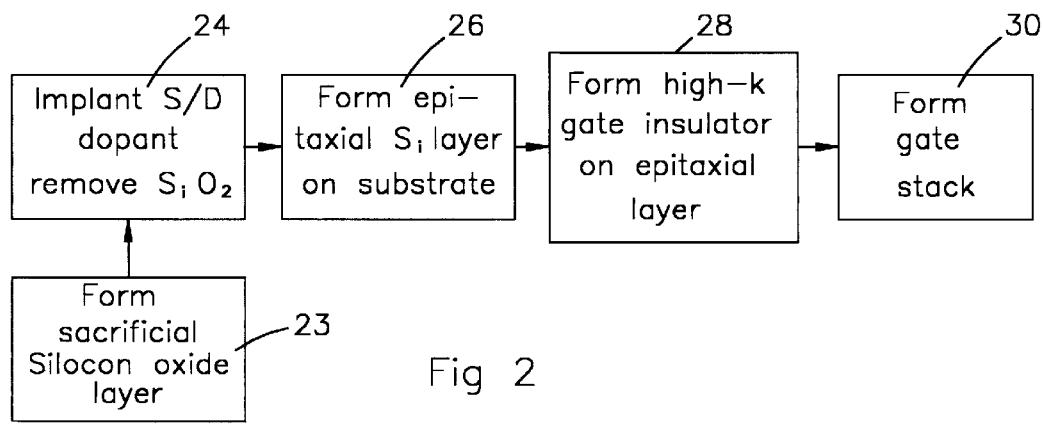
FIG. 2 is a flow chart showing the steps of the present invention.

Now referring to FIG. 2 to understand the method of the present invention, in a particularly preferred embodiment at block 23 a sacrificial layer is formed on the substrate. Preferably, the sacrificial layer is made of Silicon oxide. Then at block 24 appropriate dopant is implanted into the regions 18, 20 to establish deep source/drain regions. Nonlimiting examples of the dopant include Arsenic, Antimony, and Indium. Relatively high dopant concentrations near or at the surface of the substrate are used, with the sacrificial Silicon oxide layer facilitating a steep retrograde dopant profile. In one preferred embodiment, the range of the dopant concentration is between $5 \times 10^{16}$ to $10^{18}$ atoms per square centimeter at the surface. Also, the dopant can be implanted in more than phase at various energies and doses to establish a steep retrograde dopant profile. After dopant implantation, the sacrificial layer is removed by, e.g., etching.

Then, at block 26 the epitaxial layer 15 is formed on the surface of the substrate 16. The epitaxial layer 15 can be formed by, e.g., molecular beam epitaxy (MBE), sputtering, chemical vapor deposition (CVD), or other appropriate process.

Figure 3:
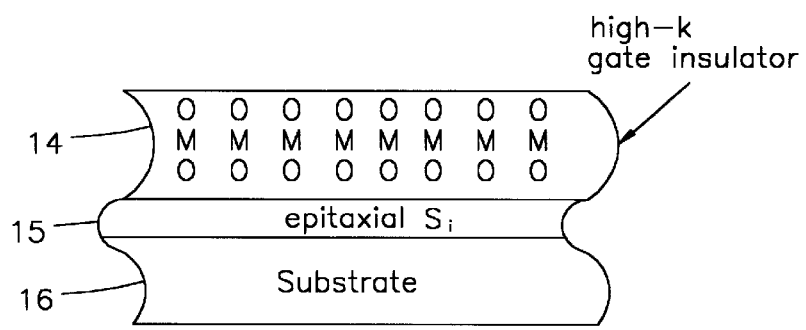
FIG. 3 is a schematic diagram showing the substrate, epitaxial layer, and epitaxial high-k gate insulator layer.

Next, moving to block 28 the gate insulator layer 14 is formed on the epitaxial layer 15, by, e.g., CVD or MBE. Like the epitaxial Silicon layer 15, the gate insulator layer 14 is also preferably an epitaxial layer. In one preferred embodiment, the insulator layer 14 is a high-k insulator grown by MBE, such as a metal oxide including but not limited to Titanium Oxide ($TiO_2$). Preferably, the gate insulator is grown in situ, immediately following the epitaxial silicon layer. FIG. 3 schematically shows two rows of Oxygen atoms (labelled "O") straddling one row of metal atoms (labelled "M") in the insulator layer 14, with the epitaxial layer 15 being sandwiched between the surface of the Silicon substrate 16 and the gate insulator layer 14 in contact therewith, and with no native oxide or interfacial oxide being formed between the insulator layer 14 and substrate 16. The gate stack 12 is then conventionally formed on the insulator layer 14 at block 30, with fabrication being conventionally completed by forming contacts, interconnects, etc.

While the particular EPITAXIAL SILICON GROWTH AND USAGE OF EPITAXIAL GATE INSULATOR FOR LOW POWER, HIGH PERFORMANCE DEVICES as herein shown and described in detail is fully capable of attaining the above-described objects of the invention, it is to be understood that it is the presently preferred embodiment of the present invention and is thus representative of the subject matter which is broadly contemplated by the present invention, that the scope of the present invention fully encompasses other embodiments which may become obvious to those skilled in the art, and that the scope of the present invention is accordingly to be limited by nothing other than the appended claims, in which reference to an element in the singular is not intended to mean "one and only one" unless explicitly so stated, but rather "one or more." Indeed, although a single transistor structure is shown in the drawings for clarity, the skilled artisan will appreciate that the chip 10 can include plural transistors, each substantially identical to that shown, as well as other circuit components. All structural and functional equivalents to the elements of the above-described preferred embodiment that are known to those of ordinary skill in the art are expressly incorporated herein by reference and are intended to be encompassed by the present claims. Moreover, it is not necessary for a device or method to address each and every problem sought to be solved by the present invention, for it to be encompassed by the present claims.

What is claimed is:

1. A MOSFET device, comprising:
    a silicon substrate having a flat top surface and having source/drain regions and a channel region between said source/drain regions, wherein said source/drain regions and said channel region are formed under said top surface of said substrate;
    a gate stack;
    a gate insulator layer between the substrate and the gate stack; and
    an epitaxial silicon layer between the gate insulator layer and the substrate, wherein said gate insulator layer is formed of a high-k insulator comprising titanium oxide (TiO2) and in direct contact with said epitaxial silicon layer, and
    wherein said epitaxial silicon layer is formed on and in direct contact with said top surface of said substrate after forming said source/drain regions, and said epitaxial silicon layer has a thickness of from 20 Angstroms to 30 nanometers and is patterned to have a substantially same width as that of said gate stack and said gate insulator layer in a gate length direction.

2. The device of claim 1, wherein said gate stack has a thickness of from 500 Angstroms to 1500 Angstroms.

3. The device of claim 1, wherein said gate insulator has a thickness of from 5 Angstroms to 100 Angstroms.

* * * * *